United States Patent
Hashimoto et al.

(10) Patent No.: US 6,715,871 B2
(45) Date of Patent: Apr. 6, 2004

(54) METHOD OF FORMING FILM PATTERN, DEVICE FOR FORMING FILM PATTERN, CONDUCTIVE FILM WIRING, ELECTRO-OPTICAL DEVICE, ELECTRONIC DEVICE, AND NON-CONTACT CARD MEDIUM

(75) Inventors: Takashi Hashimoto, Chino (JP); Masahiro Furusawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/179,387

(22) Filed: Jun. 26, 2002

(65) Prior Publication Data
US 2003/0030689 A1 Feb. 13, 2003

(30) Foreign Application Priority Data

Jun. 26, 2001 (JP) .................................. 2001-193679
Apr. 16, 2002 (JP) .................................. 2002-113586

(51) Int. Cl.[7] .................................................. B41J 2/01
(52) U.S. Cl. ...................................................... 347/102
(58) Field of Search .......................... 347/20, 95, 102, 347/101, 106; 438/149, 490, 502, 669

(56) References Cited

U.S. PATENT DOCUMENTS 5,132,248 A 7/1992 Drummond et al.
5,786,835 A * 7/1998 Ikeda et al. ................ 347/106
6,441,774 B1 * 8/2002 Pond .......................... 347/101

FOREIGN PATENT DOCUMENTS

| JP | A 59-75205 | 4/1984 |
| JP | A 10-326559 | 12/1998 |
| JP | A 11-274671 | 10/1999 |
| JP | A 2000-182513 | 6/2000 |
| JP | A 2000-195415 | 7/2000 |
| JP | A 2000-231876 | 8/2000 |
| JP | A 2000-251663 | 9/2000 |

OTHER PUBLICATIONS

English translation for Document JP 10326559.*

* cited by examiner

Primary Examiner—Stephen D. Meier
Assistant Examiner—An H. Do
(74) Attorney, Agent, or Firm—Oliff & Berridge, PLC

(57) ABSTRACT

The present invention provides a method of forming a functional film pattern which allows the forming of fine film patterns with simplified steps. The present invention also provides a method of forming a functional film pattern where such defects as disconnection and short circuit rarely occurs, and forming a pattern which has a large thickness and is good for exhibiting a function such as electric conduction can be formed.

8 Claims, 10 Drawing Sheets

METHOD OF FORMING FILM PATTERN, DEVICE FOR FORMING FILM PATTERN, CONDUCTIVE FILM WIRING, ELECTRO-OPTICAL DEVICE, ELECTRONIC DEVICE, AND NON-CONTACT CARD MEDIUM

BACKGROUND OF THE INVENTION

1. Field of the Invention

The present invention relates to a device fabrication method and fabrication device, more particularly to a method of forming a prescribed pattern on a substrate using a liquid coating device such as an inkjet recording device, and improvement of the device.

2. Description of the Related Art

Semiconductor devices and other circuit devices are fabricated by forming a circuit pattern, wiring pattern and other functional film patterns on silicon, glass, PET (polyethylene terephthalate), or other substrates. For the fabrication of such devices, a lithography method, for example, has been used. In the lithography method, a photosensitive agent called a "resist" is coated on the substrate, a circuit pattern is irradiated and developed, and the circuit pattern is formed by implanting metal ions. This lithography method requires large-scale equipment, such as a vacuum system, and complicated steps. The material utilization efficiency in the lithography method is only several parts per hundred and most material is disposed. Therefore, the fabrication cost is high.

In U.S. Pat. No. 5,132,248, a method of coating liquid where particles are disposed directly on the substrate to be a pattern by an inkjet method, and transforming the pattern into a conductive film pattern by executing heat treatment and laser irradiation, is proposed. According to this method, photolithography is unnecessary, and the processing is dramatically simplified. However, although the patterning by such an inkjet method has a merit where the processing steps are simple and the amount of raw materials to be used is small, appropriate processing must be performed, such as using the later mentioned banks, to control the liquid on the substrate, which makes it difficult to fabricate a conductive pattern having a desired shape.

Japanese Patent Publication No. S59-75205, on the other hand, states that the coating position of the liquid is controlled by forming banks on the substrate and coating functional liquid in the banks. In this method, the banks are still formed by photolithography, which leads to high cost.

It is also known that after forming a pattern with lyophilic sections and repellent sections on a substrate, liquid material is selectively coated on the lyophilic section by a method such as inkjet. The resolution or this inkjet type recording head is fine, such as 400 dpi, so prescribed patterns in a $\mu$m order width can be formed without such a facility as a semiconductor factory. With this method, however, the process of forming patterns for the lyophilic sections and repellent sections using masks is required, and if coating is by an inkjet method, then alignment marks and alignment steps for accurately coating liquid on the lyophilic sections are required, which makes the process complicated. Also, since liquid is ejected to the lyophilic sections, liquid droplets spread and it is difficult to make a thick conductive film. It is possible to increase the number of times of ejection to increase the film thickness, but in this case, the repellency of the repellent sections with respect to ink must be quite high so that the ink is contained in the lyophilic patterns. Also the line width of the wiring to be formed is limited to the width of the pattern of a lyophilic section of the substrate.

SUMMARY OF THE INVENTION

It is an object of the present invention to provide a functional film pattern forming method which can form fine film patterns with simplified processing steps. It is also an object of the present invention to provide a functional film pattern forming method which rarely causes such defects as disconnection and short circuit, and can form patterns with a large film thickness which are good for exhibiting such functions as electric conduction.

It is another object of the present invention to provide a film pattern forming device which can easily form fine film patterns.

It is still another object of the present invention to provide conductive film wiring which has a large film thickness, good for electric conduction, rarely causes such defects as disconnection and short-circuit, and which can be formed fine.

It is still another object of the present invention to provide an electro-optical device which rarely causes such defects as disconnection and short-circuit of the wiring section and antenna, and can decrease the size and thickness of the device, the electronic device and the non-contact card medium using this electro-optical device.

The pattern forming method according to the present invention is a method or forming a functional film pattern by ejecting liquid containing functional components onto a substrate by inkjet, comprising a step of ejecting the above-mentioned liquid by inkjet onto the substrate having a functional film forming face where the contact angle with respect to the liquid is 30 deg. or more and 60 deg. or less, and a step of transforming the ejected liquid into a functional film by a heat treatment.

If the contact angle is smaller than 30 deg., liquid droplets spread too much on the substrate, which forms a functional film pattern with irregular shapes. And if the contact angle is greater than 60 deg., inkjet liquid droplets ejected onto the substrate are taken into liquid already on the substrate when making contact with the liquid already on the substrate, which causes such defects as disconnection in the functional film pattern.

If liquid is ejected onto the substrate which has appropriate repellency by inkjet, the spread of ejected liquid droplets after attaching to the substrate can be controlled, and a fine and thick functional film pattern can be directly formed, and also such pattern defects as disconnection, caused when inkjet liquid droplets attach to the substrate and are taken into liquid already on the substrate when making contact with the liquid already on the substrate, can be prevented. Also the process can be simple since the step of performing pattern processing on the substrate is not required, and also a desired functional pattern can be easily formed since the shape of the functional film pattern is not limited to the pattern of the substrate, for example, and the line width of the lines can be adjusted by changing the volume of the inkjet liquid droplets by changing the voltage for ejection.

In the step of ejection by inkjet of the above-mentioned pattern forming method, it is preferable that liquid is ejected such that the distance between the center of the inkjet liquid droplets adjacent to each other on the substrate is greater than the sum of the radius of the inkjet liquid droplets attached to the substrate and the radius of the inkjet liquid droplets before attaching to the substrate, and is smaller than double the radius of the inkjet liquid droplets attached to the substrate. If the inkjet liquid droplets are ejected without directly contacting the liquid droplets already attached to the substrate so as to connect with liquid droplets already attached to the substrate by the spread of newly ejected liquid droplets after being attached to the substrate, irregularities generated on the lines due to the shock caused when inkjet liquid droplets directly contact the liquid droplets already attached to the substrate, causing such defects as disconnection, can be prevented. Also if the ejection space is smaller than double the radius of the liquid droplets on the substrate, the status where lines are not formed due to liquid droplets not connecting to each other can be prevented.

In the above-mentioned pattern forming method, it is preferable that the step of ejection by inkjet ejects the liquid such that 1% or more and 10% or less of overlap of the diameter of liquid is formed when the liquid is attached to the substrate. By controlling the overlap to 10% or less, an excessive amount of liquid to be coated per unit length of a line can be prevented, and the generation of bulges can be prevented. By controlling the overlap to 1% or more, no overlap of liquid droplets being generated due to ejection position accuracy errors can be prevented, and the disconnection of a line can be avoided. A bulge is a swollen patch of liquid generated by the gathering of liquid at a certain part of a line, as shown in FIG. 3. Bulges become the cause of the disconnection of a line and a short-circuit with another line.

It is also preferable that the above-mentioned pattern forming method further comprises a step of ejecting the liquid again onto the functional film by inkjet after executing the above-mentioned ejecting step and transformation step. The method further comprises a step of transforming the lately ejected liquid into the functional film by a heat treatment. After the functional film transforming step, the substrate has repellency and the transformed functional film is lyophilic, so by coating the liquid thereon again, the liquid remains on the functional film without flowing onto the substrate, and a functional film pattern with a thicker film can be formed without increasing the line width.

It is also preferable that the above-mentioned pattern forming method further comprises a step or drying the ejected liquid after the above-mentioned ejecting step and before the step of transforming the ejected liquid into the functional film, and a step of ejecting the liquid again by inkjet on the dried liquid. The drying step here is a step of removing a part or all of the solvent, and is performed by a heat treatment at a temperature lower than the functional film transforming step, and with this drying step alone, the function of the functional components cannot be sufficiently or can barely be exhibited. Since the substrate has repellency after the drying step and the dried liquid is lyophilic, a functional film pattern with a thicker film can be formed by coating liquid again thereon. The drying step is performed by a heat treatment at a temperature lower than the functional film transforming step, so the processing time can be decreased and the energy to be used can be decreased compared with the case of ejecting liquid again after the functional film transforming step.

Also it is preferable that the above-mentioned pattern forming method further comprises a surface treatment step for processing the above-mentioned substrate surface to be a functional film forming face where the contact angle with respect to the above-mentioned liquid is 30 deg. or more and 60 deg. or less.

The above-mentioned pattern forming method is suitably used for forming the patterns of conductive film wiring. In this case, it is preferable that the liquid to be ejected by inkjet contains conductive particles.

The pattern forming device according to the present invention is a device for forming a functional film pattern by ejecting liquid containing functional components onto a substrate by inkjet, comprising inkjet ejecting means for ejecting the liquid by inkjet onto a substrate having a functional film forming face where the contact angle with respect to the liquid is 30 deg. or more and 60 deg. or less, and heat treatment means for transforming the ejected liquid into a functional film by a heat treatment. This pattern forming device is suitably used for forming patterns of conductive film wiring by ejecting the liquid containing conductive particles, for example.

The conductive film wiring of the present invention is formed by the above-mentioned pattern forming method. According to this, a conductive film wiring, where the film thickness is thick and is good for electric conduction, such defects as disconnection and short circuit rarely occurs, and fine patterns can be formed, can be provided.

The electro-optical device according to the present invention is comprised of conductive film wiring according to the above-mentioned invention. The electro-optical device according to the present invention is, for example, a liquid crystal display device, an organic electro-luminescent display device, and a plasma display device.

The electronic device according to the present invention is comprised of the electro-optical device according to the present invention.

The non-contact card medium according to the present invention has the conductive film wiring according to the above-mentioned invention as an antenna circuit.

According to these inventions, an electro-optical device which rarely causes such defects as disconnection and short-circuit of wiring sections and antennas, and can decrease size and thickness, and an electronic device and a non-contact card medium using this electro-optical device, can be provided.

DESCRIPTION OF THE PREFERRED EMBODIMENTS

Figure 1:
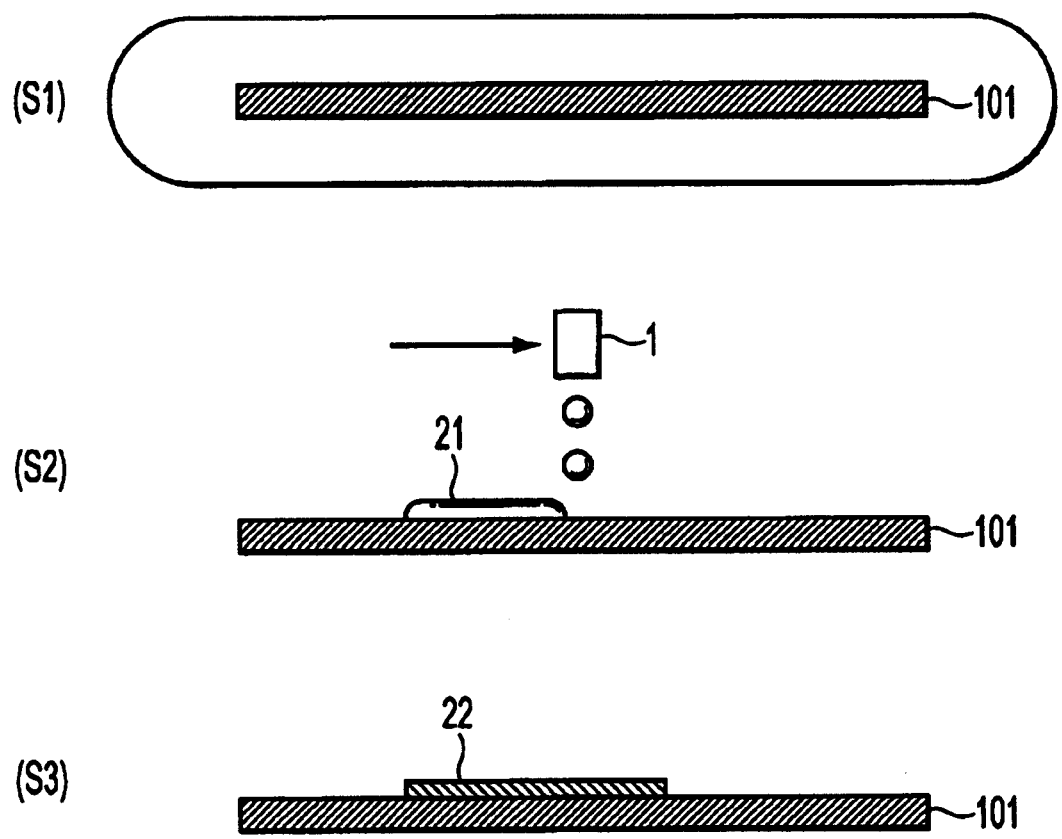
FIG. 1 is a diagram showing the fabrication steps of the film pattern forming method according to an embodiment of the present invention.

The film pattern forming method according to embodiments of the present invention will now be described with reference to the accompanying drawings. FIG. 1 is a diagram showing the fabrication process by the film pattern forming method according to an embodiment of the present invention.

<1-1. First Embodiment: Conductive Film>

The conductive film pattern forming method, which is an example of the film pattern forming method of the present invention, will now be described as the first embodiment. The conductive film pattern forming method according to the present embodiment is comprised of a surface treatment step, a coating step and a heat treatment step.

(Surface Treatment Step)

As FIG. 1 (S1) shows, a self organizing film comprised of fluoroalkylsilane is formed on the surface of a substrate 101 where a conductive film pattern will be formed, so that a predetermined contact angle is formed with respect to the liquid containing conductive particles. The contact angle with respect to the liquid containing conductive particles is preferably 30 deg. or more and 60 deg. or less.

For the substrate 101, any one of Si wafer, quartz glass, glass, plastic film, metal plate and various other materials can be used, and semi-conductive film, metal film, dielectric film or organic film may be formed on the substrate surface as an under layer.

The organic film material for treating the substrate surface is comprised of a functional group which can bond with the substrate, a functional group for reforming the surface of the substrate (controlling surface energy), such as a lyophilic group or repellent group, which exits at the opposite side of the functional group which can bond with the substrate, and a straight chain of carbon or a partially branched carbon chain for connecting these functional groups. This material bonds with the substrate, self-organizes and forms a molecular film, such as monomolecular film.

This self organizing film is comprised of a bonding functional group which can react with atoms constituting the under layer, such as a substrate, and other straight chain molecules, which is formed by orienting a compound which has an extremely high orientation characteristic due to the interaction of the straight chain molecules. Since this self organizing film is made of oriented monomolecules, film thickness can be extremely thin, and is uniform at the molecular level. In other words, since molecules of the sane structures are positioned on the surface of the film, a uniform and excellent lyophilic and repellency characteristics can be provided to the surface of the film.

If fluoroalkylsilane is used for the compound having a high orientation characteristic, for example, the self organizing film is formed by each compound being oriented such that the fluoroalkyl group positions on the surface of the film, so that uniform repellency can be provided on the surface of the film.

Compounds for forming such a self organizing film are fluoroalkylsilane, such as heptadecafluoro-1,1,2,2 tetrahydrodesyltriethoxysilane, heptadecafluoro-1,1,2,2 tetrahydrodesyltrimethoxysilane, heptadecafluoro-1,1,2,2 tetrahydrodesyltrichlorosilane, tridecafluoro-1,1,2,2 tetrahydrooctyltriethoxysilane, tridecafluoro-1,1,2,2 tetrahydrooctyltrimethoxysilane, tridecafluoro-1,1,2,2 tetrahydrooctyltrichlorosilane and trifluoropropyltrimethoxysilane (hereafter "FAS"). For use, it is preferable to use one compound, but two or more types of compounds may be combined if the original object of the present invention is not interrupted. Also in the present invention, it is preferable to use the above-mentioned FAS as a compound to form the self organizing film to provide adhesion with the substrate and good repellency.

FAS is generally expressed by a constitutional formula $RnSiX_{(4-n)}$. Here n is a 1 or higher and a 3 or lower integer, X is a hydrolysis group such as the methoxy group, ethoxy group and halogen atoms. R is a fluoroalkyl group, which has the structure $(CF_3)$ $(CF_2)_x$ $(CH_2)_y$ (where x is a 0 or higher and a 10 or lower integer, y is a 0 or higher and a 4 or lower integer), and if a plurality of groups R or X are combined with Si, then all the groups R or X may be the same or different. The hydrolysis group expressed by X forms silanol by hydrolysis, and bonds with the substrate by siloxane bonding, reacting with the hydroxyl group of the substrate (glass, silicon). R on the other hand, has a fluoro group such as $(CF_3)$ on the surface, which reforms the surface of the substrate into a surface which does not get wet (surface energy is low).

Now the lyophilic section will be described. In the later mentioned area where the self organizing film is removed by ultraviolet, a hydroxyl group exists on the surface. Therefore this area exhibits a nature which very easily wets compared with the area of FAS. So after FAS is formed on the entire surface of the substrate, if FAS of a part or the area is removed, the area exhibits a lyophilic characteristic.

The self organizing film is formed on the substrate 101 when the above-mentioned raw material compound and the substrate 101 are set in the same sealed container and left for 2–3 days at room temperature (S1). If the entire sealed container is held at 100° C., the self organizing film is formed on the substrate 101 in about three hours. This is a method of forming self organizing film from a vapor phase, but self organizing film can be formed from a liquid phase as well. For example, when the substrate is dipped into a solution containing the raw material compound, and is cleaned and dried, the self organizing film is generated on the substrate.

It is preferable to execute pretreatment on the surface of the substrate by irradiating ultraviolet, or cleaning using solvent before forming the self organizing film.

(Coating Step)

Then as FIG. 1 (S2) shows, liquid 21 containing conductive particles on the substrate 101 is coated on the substrate 101 by inkjet.

For the particles used here, metal particles which contain gold, silver, copper, palladium, or nickel, and a conductive polymer or superconductive particles are used. In the present embodiment, liquid where such particles are dispersed in a solvent are used. To disperse the particles, organic matter may be coated on the particle surface for use. To coat the particles on the substrate, it is preferable that the size of the particle is 50 nm or more and 0.1 μm or less, in terms of easy dispersion into the solvent and the application of the inkjet method.

The liquid is prepared by dispersing the above-mentioned particles in the solvent. The solvent used here is preferably one that has a vapor pressure at room temperature thereof of 0.001 mmHg or more and 200 mmHg or less. If the vapor pressure is higher than 200 mmHg, the solvent evaporates first when the coating film is formed, which makes it difficult to form a good coating film. If the vapor pressure at room temperature is lower than 0.001 mmHg, on the other hand, drying becomes slow and solvent tends to remain in the coating film, therefore it is difficult to obtain a good quality conductive film after heat and/or optical processing in a post processing step. If the solvent is coated by the later mentioned inkjet device, the vapor pressure of the solvent is preferably 0.001 mmHg or more and 50 mmHg or less. If the vapor pressure is higher than 50 mmHg, nozzle clogging tends to occur, because the solvent dries up when the liquid droplets are ejected by the inkjet device, which makes stable ejection difficult. If the vapor pressure is lower than 0.001 μmmHg, on the other hand, drying of ejected ink becomes slow and solvent tends to remain in the conductive film, which makes it difficult to form good quality conductive film after heat treatment in a post processing step.

The solvent to be used is not particularly restricted only if the solvent can disperse the above-mentioned particles and does not coagulate, for example, water, alcohol such as methanol, ethanol, propanol and butanol, hydrocarbon solvent such as n-heptane, n-octane, decane, toluene, xylene, cymene, dulene, indent, dipentene, tetrahydronaphthalene, decahydronaphthalene and cyclohexylbenzene, ether solvent such as ethyleneglycoldimethyl ether, ethyleneglycoldiethyl ether, ethyleneglycolmethylethyl ether, diethyleneglycoldimethyl ether, diethylenglycoldiethyl ether, diethyleneglycolmethylethyl ether, 1,2-dimethoxyethane, bis (2-methoxyethyl)ether, and p-dioxane, and polar solvent such as propylene carbonate, γ-butyrolactone, N-methyl-2-pyrolidone, dimethylformamide, dimethylsulfoxide and cyclohexanone can be used. Among these, water, alcohol, hydrocarbon solvent and ether solvent are preferable in terms of the dispersion of particles, stability of dispersion solution, and easy application to the inkjet method, where water and hydrocarbon solvent are especially preferable. These solvents can be used alone or as a mixture of two or more types of solvents.

The solute density when the above-mentioned particles are dispersed in solvent is 1% by weight or more and 80% by weight or less, which can be adjusted according to the desired film thickness of the conductive film. If 80% by weight is exceeded, coagulation tends to occur, which makes it difficult to form a uniform coating film.

In the above-mentioned particle dispersed solution, a small amount of fluorine, silicon or nonionic surface tension modifier can be added if necessary within a range where the target function is not interfered with. The nonionic surface tension modifier helps to improve the wettability of the solution to the coating object, improve the evenness of the coated film, and prevent the generation of roughness of the coated film and the generation of goose bumps.

The viscosity of the particle dispersed solution prepared in this way is preferably 1 mPa·s or more and 50 mPa·s or less. This is because when liquid is coated using the later mentioned inkjet device, the area around the nozzle is easily contaminated by ejected ink if the viscosity is smaller than 1 mPa·s, and if the viscosity is higher than 50 mPa·s, the frequency of clogging which occurs at the nozzle increases, which makes the smooth ejection of liquid droplets difficult.

It is preferable that the surface tension of the particle dispersed solution prepared in this way is in the range of 20 dyn/cm or more and 70 dyn/cm or less. This is because when liquid is coated using the later mentioned inkjet device, the wettability of the ink composition with respect to the nozzle surface increases, and the ejection direction tends to deviate if the surface tension is less than 20 dyn/cm, and the shape of the meniscus at the tip of the nozzle becomes unstable, which makes it difficult to control the ejection amount and the ejection timing of the ink composition it the surface tension exceeds 70 dyn/cm.

The liquid 21 is ejected by an inkjet method. The space of the ink droplets to be attached on the substrate is controlled by controlling the ejection frequency and the relative speed of the inkjet head and substrate. It is particularly preferable that the ink droplets are attached on the substrate such that 1% or more and 10% or less of the diameter of the ink droplets adjacent to each other within a same wiring overlap. In other words, the space of ink droplets is preferably 90% or more and 99% or less of the diameter of ink droplets attached on the substrate. If the space of the ink droplets is smaller than this and the ink droplets overlap more, bulging occurs which make it impossible to form fine lines. If the space of the ink droplets is wider than this and the overlap of the ink droplets decreases, an overlap of liquid no longer occurs if an ejection position accuracy error occurs, in which case wiring may be disconnected.

(Heat Treatment Step)

As FIG. 1 (S3) shows, the substrate 101 where the particle dispersed solution 21 is coated in a predetermined pattern is heat treated to remove the solvent and to improve the electric contact between particles. Heat treatment is normally executed in air, but when necessary, the heat treatment may be executed in an inactive gas atmosphere such as nitrogen, argon and helium. The temperature of the heat treatment is appropriately set depending on the boiling point (vapor pressure) of the solvent, pressure and thermal behavior of the particles, and is not particularly limited, but a room temperature or higher and 300° C. or lower is preferable. If a substrate such as plastic is used, the processing temperature is preferably a room temperature or higher and 100° C. or lower.

Heat treatment can be executed with a normal hot plate or electric furnace, but lamp annealing can also be used. The light source of the light to be used for lamp annealing is not particularly limited, and an infrared lamp, Xenon lamp, YAG laser, argon laser, carbon dioxide laser, and excimer lasers such as XeF, XeCl, XeBr, KrF, KrCl, ArF and ArCl can be used as the light source. These light sources are generally used in the output range of 10W or more and 5000W or less, but 100W or more and 1000W or less is sufficient for the present embodiment.

The conductive film 22 is formed by the above-mentioned steps. According to the present embodiment, the conductive film pattern with narrow width and large thickness can be formed without generating bulges.

<1-2. Second Embodiment: Silicon Film>

The silicon film pattern forming method, which is an example of the film pattern forming method of the present invention, will now be described as the second embodiment. The silicon film pattern forming method according to the present embodiment is comprised of a surface treatment step, coating step and heat treatment step.

(Surface Treatment Step)

As FIG. 1 (S1) shows, a self organizing film comprised of fluoroalkylsilane is formed on the surface of the substrate 101 where a silicon film pattern will be formed, so that a predetermined contact angle is formed with respect to the liquid containing organic silicon compound. The contact angle with respect to the liquid containing organic silicon compound is preferably 30 deg. or more and 60 deg. or less.

The method for controlling the lyophilic characteristic (wettablility) of the surface and the substrate 101 are the same as the first embodiment, so descriptions thereof are omitted.

(Coating Step)

As FIG. 1 (S2) shows, liquid 21 containing an organic silicon compound is coated on the substrate 101 by an inkjet method.

For the liquid containing organic silicon compound, a solution where an organic silicon compound is dissolved in the solvent is used. The organic silicon compound used here is a silane compound that has a cyclic system expressed by the general formula $Si_nX_m$ (here X indicates a hydrogen atom and/or a halogen atom, n indicates a 3 or higher integer, and m indicates the integer n or 2n−2 or 2n or 2n+2).

Here n is 3 or higher, but a cyclic silane compound where n is 5–20, particularly 5 or 6, is preferable in terms of thermodynamic stability, solubility, and ease of refinement. If n is less than 5, then handling of silane compound becomes difficult, since silane compound itself becomes unstable by distortion due to the cycle. If n is greater than 20, solubility drops due to the cohesive force of the silane compound, which decreases the choice of solvents which can be used.

X of the general formula $Si_nX_m$ of the silane compound to be used for the present invention indicates a hydrogen atom and/or a halogen atom. These silane compounds are precursor compounds of the silicon film, so these compounds must ultimately be processed into an amorphous or polycrystalline silicon by a heat treatment and/or light treatment, where silicon-hydrogen bonding and silicon-halogen bonding are cleaved, generating a new silicon—silicon bonding, finally changing into silicon. A halogen atom is a normal fluorine atom, chlorine atom, bromine atom, or iodine atom, but chlorine and bromine are preferable in terms of the above-mentioned bonding and cleaving. X may be a hydrogen atom alone or a halogen atom alone, or may be a partially halided silane compound, where the total of hydrogen atoms and halogen atoms are m.

The solvent of the liquid containing organic silicon compound is preferably one with a vapor pressure at a room temperature of 0.001 mmHg or more and 200 mmHg or less. The reason is the same as the case of the liquid containing conductive particles in the first embodiment, so descriptions thereof are omitted. If the above-mentioned solution is coated by an inkjet device, the vapor pressure of the solvent is preferably 0.001 mmHg or more and 50 mmHg or less. The reason is the same as the case of the liquid containing conductive particles in the first embodiment, so descriptions thereof are omitted.

The solvent to be used is not particularly limited only if the solvent can dissolve the above-mentioned organic silicon compound, for example, a hydrocarbon solvent such as n-heptane, n-octane, decane, toluene, xylene, cymene, dulene, indene, dipentene, tetrahydronaphthalene, decahydronaphthalene, and cyclohexylbenzene, an ether solvent such as ethyleneglycoldimethyl ether, ethyleneglycoldiethyl ether, ethylenglycolmethylethyl ether, diethyleneglycoldimethyl ether, diethyleneglycoldiethyl ether, diethyleneglycolmethylethyl ether, 1,2-dimethoxyethane, bis(2-methoxyethyl) ether, and p-dioxane, and polar solvent such as propylene carbonate, γ-butyrolactone, N-methyl-2-pyrrolidone, dimethylformamide, dimethylsulfoxide, and cyclohexanone. Among these, a hydrocarbon solvent and ether solvent are preferable in terms of the solubility of the organic silicon compound and stability of the solution thereof, and a hydrocarbon solvent is especially preferable. These solvents can be used alone or as a mixture of two or more types of solvents.

The solute density when the above-mentioned organic silicon compound is dissolved in the solvent is 1% by weight or more and 80% by weight or less, which can be adjusted according to the desired silicon film thickness. If 80% by weight is exceeded, coagulation tends to occur, which makes it difficult to form a uniform film.

In the above-mentioned solution, a small amount of fluorine, silicon or nonionic surface tension modifier can be added in a range where the target function is not interfered with. The nonionic surface tension modifier helps to improve the wettability of the solution to the coating object, improve the evenness of the coated film, and prevent the generation of roughness of the coated film and the generation of goose bumps.

The viscosity of the above-mentioned solution is preferably 1 mPa·s or more and 50 mPa·s or less. The reason is the same as the case of the liquid containing conductive particles in the first embodiment, so descriptions thereof are omitted.

It is preferable that the surface tension of the above-mentioned solution is in the range of 20 dyn/cm or more and 70 dyn/cm or less. The reason is the same as the case of the liquid containing conductive particles in the first embodiment, so descriptions thereof are omitted.

The above-mentioned solution is ejected by an inkjet method. The ejection step is generally executed in room temperature or higher and 10° C. or less. This is because the solubility of organic silicon compound droplets at a temperature lower than room temperature, and may partially precipitate. The atmosphere of ejection is preferably in an inactive gas such as nitrogen, and helium and argon. When necessary, the mixing of reducing gas such as hydrogen is preferable.

The ejection conditions for pattern forming, such as the space between each of the ejected liquid droplets, are the same as the case of the first embodiment, so descriptions thereof are omitted.

(Heat Treatment Step)

As FIG. 1 (S3) shows, the substrate 101 where the solution 21 of organic silicon compound is coated in a predetermined pattern is heat treated to remove the solvent and to transform the organic silicon compound into amorphous or polycrystalline silicon. The heat treatment may be executed in inactive gas such as nitrogen, argon and helium. The processing temperature of the heat treatment is appropriately set depending on the boiling point (vapor pressure) of the solvent, pressure, and the thermal behavior of the organic silicon compound.

When the substrate 101 with a predetermined pattern is treated at 100–800° C., preferably at 200–600° C., and more preferably at 300–500° C. in a normal argon atmosphere or in argon containing hydrogen, amorphous silicon film is generally formed if the reached temperature is 550° C. or less, and polycrystalline silicon film is formed if the temperature is higher. If the reached temperature is less than 300° C., the thermal decomposition of the organic silicon compound does not sufficiently progress, and silicon film with sufficient thickness may not be formed. To form polycrystalline silicon film, amorphous silicon film formed as above can be transformed into polycrystalline silicon film by laser annealing. In the case when laser annealing is performed as well, the atmosphere is preferably an inactive gas such as helium and argon, or an atmosphere where a reducing gas such as hydrogen is mixed to the above-mentioned inactive gas.

The heat treatment can be executed with a normal hot plate or electric furnace, but lamp annealing can also be used. The light source of the light to be used for lamp annealing is not particularly limited, and an infrared lamp, Xenon lamp, YAG laser, argon laser, carbon dioxide laser, and excimer lasers such as XeF, XeCl, XeBr, KrF, KrCl, ArF and ArCl can be used as the light source. These light sources are generally used in an output range of 10W or more and 5000W or less, but 100W or more and 1000 W or less is sufficient for the present embodiment.

Amorphous or polycrystalline silicon film 22 is formed by the above-mentioned steps. According to the present embodiment, a silicon film pattern with narrow width and large thickness can be formed without generating bulges.

<1-3. Third Embodiment: Ferro-Electric Film>

A ferro-electric film pattern forming method, which is an example of the film pattern forming method of the present invention, will now be described as the third embodiment. The ferro-electric film pattern forming method according to the present embodiment is comprised of a surface treatment step, coating step, and heat treatment step.

(Surface Treatment Step)

As FIG. 1 (S1) shows, a self organizing film comprised of fluoroalkylsilane is formed on the substrate 101 where the ferro-electric film pattern will be formed, so that a predetermined contact angle is formed with respect to the liquid containing the precursor compound of the ferro-electric substance. The contact angle with respect to the liquid containing the precursor compound of the ferro-electric substance is preferably 30 deg. or more and 60 deg. or less.

The method for controlling the repellency (wettability) of the surface and the substrate 101 are the same as the first embodiment, so descriptions thereof are omitted.

(Coating Step)

As FIG. 1 (S2) shows, liquid 21 containing the precursor compound of the ferro-electric substance is coated on the substrate 101 by an inkjet method.

For the liquid containing precursor compound of the ferro-electric substance, a sol solution of the precursor compound of the ferro-electric substance is used. The type of the ferro-electric substance is not particularly limited, but lead zirconate titanate (Pb(Zr, Ti)O$_3$: PZT) is preferable for example. Now an example of how to prepare the sol solution of the precursor compound of PZT will be described. For the organic solvent, 2-n-butoxyethanol which is represented by the chemical formula, $CH_3(CH_2)_3OCH_2CH_2OH$ is used. Sol is made from the solution obtained by adding, into this organic solvent, the material components of PZT, that is, lead acetate: $Pb(CH_3COO)_2.H_2O$, zirconium acetylacetonato: $Zr(CH_3COCHCOCH_3)_4$, and titanium tetraisopropoxide: $Ti[(CH_3)_2 CHO]_4$. The mixing ratio of the lead acetate, zirconiumacetylacetonato and titaniumtetraisopropoxide is 100:52:48. As an additive, 0.1 mol % of potassium acetate is added. The method of preparing the sol solution of the precursor compound of PZT is not limited to the above.

The solute density of the sol solution of the precursor compound of the ferro-electric substance is 1% by weight or more and 80% by weight or less, which can be adjusted according to the desired ferro-electric film thickness. If 80% by weight is exceeded, coagulation tends to occur, which makes it difficult to form a uniform film.

In the above-mentioned sol solution, a small amount of fluorine, silicon or nonionic surface tension modifier can be added when necessary within a range where the target function is not interfered with. The nonionic surface tension modifier helps to improve the wettability of the solution to the coating object, improve the evenness of the coated film, and prevent the generation of roughness of the coated film and generation of goose bumps.

The viscosity of the above-mentioned sol solution is preferably 1 mPa·s or more and 50 mPa·s or less. The reason is the same as the case of the liquid containing conductive particles in the first embodiment, so descriptions thereof are omitted.

It is preferable that the surface tension of the above-mentioned solution is in the range of 20 dyn/cm or more and 70 dyn/cm or less. The reason is the same as the case of the liquid containing conductive particles in the first embodiment, so descriptions thereof are omitted.

The above-mentioned sol solution is ejected by an inkjet method. The ejection conditions for pattern forming, such as the space between each of the ejected liquid droplets, are the same as the case of the first embodiment, so descriptions thereof are omitted.

(Heat Treatment Step)

As FIG. 1 (S3) shows, the substrate 101 where the sol solution 21 is coated in a predetermined pattern is heat treated so that the solvent is dried, degreased and finally transformed into ferro-electric film. The heat treatment is normally executed in air, but may be executed in an inactive gas atmosphere such as nitrogen, argon and helium. The processing temperature of the heat treatment is appropriately set yet is not especially limited, but it is preferable that the drying step is executed at room temperature or higher and 200° C. or lower, and that the degreasing step is executed at 300° C. or higher and 500° C. or lower, and the ferro-electric film transformation process is executed at 700° C. or higher.

The heat treatment can be executed with a normal hot plate or electric furnace, but lamp annealing can also be used. The light source of the light to be used for lamp annealing is not particularly limited, and an infrared lamp, Xenon lamp, YAG laser, argon laser, carbon dioxide laser, and excimer lasers such as XeF, XeCl, XeBr, KrF, KrCl, ArF and ArCl can be used as the light source. These light sources are generally used in the range of output 10W or more and 5000W or less, but 100W or more and 1000W or less is sufficient for the present embodiment.

The ferro-electric film 22 is formed by the above-mentioned steps. According to the present embodiment, the ferro-electric film pattern that is fine and thick can be formed without generating bulges.

<2. Film Pattern Forming Device>

Figure 2:
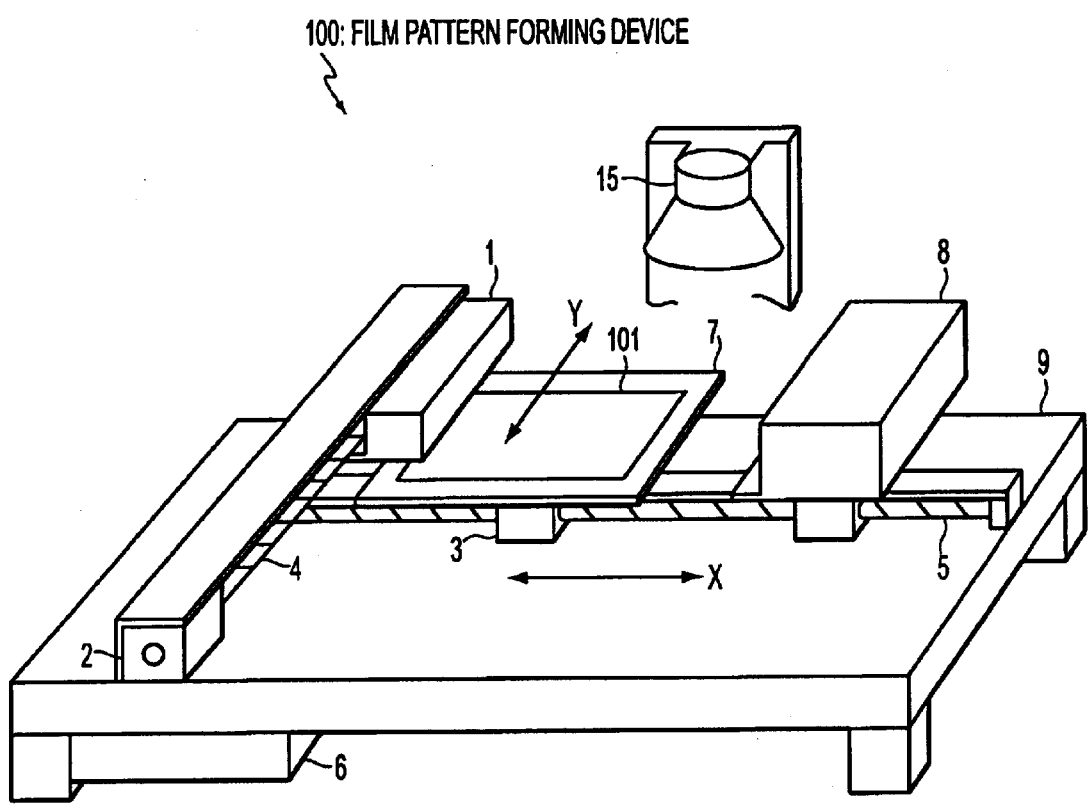
FIG. 2 is a perspective view showing a film pattern forming device used for the film pattern forming method according to an embodiment of the present invention.

FIG. 2 is a perspective view showing the film pattern forming device used for the film pattern forming method of the present invention. The film pattern forming device 100 has an inkjet type liquid coating device, and is comprised of an inkjet head group 1, X direction driving shaft 4, Y direction guide shaft 5, controller 6, mounting stand 7, cleaning mechanism 8, base 9, and heater 15.

The inkjet head group 1 has heads, which is the inkjet ejecting means, for ejecting a predetermined liquid from the nozzle (ejection outlet) and attaching the liquid on the substrate at a predetermined space.

The mounting stand 7 is for mounting the substrate 101 where liquid is attached by this coating device, and has a mechanism for securing this substrate 101 at a reference position.

To the X direction driving shaft 4, an X direction driving motor 2 is connected. The X direction driving motor 2 is a stepping motor, for example, and rotates the X direction driving shaft 4 when a driving signal in the X axis direction is supplied from the controller 6. When the x direction driving shaft 4 rotates, the inkjet head group 1 moves in the X axis direction.

The Y direction guide shaft 5 is secured so as not to relatively move from the base 9. The mounting stand 7 is a Y direction driving motor 3. The Y direction driving motor 3 is a stepping motor, for example, and moves the mounting stand 7 in the Y axis direction when a driving signal in the Y axis direction is supplied from the controller 6.

The control circuit 6 supplies voltage for liquid droplets ejection control to each head of the inkjet head group 1. The control circuit 6 also supplies the driving pulse signal for controlling the movement of the inkjet head group 1 in the X axis direction to the X direction driving motor 2, and supplies the driving pulse signal for controlling the mounting stand 7 in the Y axis direction to the Y direction driving motor 3.

The cleaning mechanism section 8 is comprised of a mechanism for cleaning the inkjet head group 1. The cleaning mechanism section 8 has a Y direction driving motor, which is not illustrated. By the driving of this Y direction driving motor, the cleaning mechanism 8 moves along the Y direction guide shaft 5. The movement of the cleaning mechanism 8 is also controlled by the controller 6.

The heater 15 is a means of performing heat treatment for the substrate 101 by lamp annealing, which evaporates and dries the liquid coated on the substrate, and transforms the liquid into a film of a functional material. Power ON/OFF of this heater is also controlled by the control circuit 6. According to the film pattern forming device 100 of the present invention, a film pattern with narrow width and large thickness can be formed without generating bulges.

3-1. EXAMPLE 1

Space of Liquid Droplets

A liquid where xylene was added to a gold particle dispersed solution, where gold particles with a 10 nm diameter were dispersed in toluene (available at Vacuum Metallurgical Co., Ltd., product name: Perfect Gold) with a viscosity of 3 centipoises, was ejected onto the glass substrate, for which repellency treatment had been performed, at a predetermined dot space by the inkjet device, and conductive film lines were formed. The dot space was changed by controlling only the ejection frequency, keeping the stage moving speed constant. As the inkjet head, the head of a commercial printer (product name: MJ930C) was used. Since the ink inlet section was made of plastic, the inlet section was changed to a metal jig so that it does not dissolve in organic solvent.

The repellency treatment of the substrate was performed by the following method. At first, the glass substrate was cleaned as a pretreatment by irradiating ultraviolet with a wavelength of 172 nm at 10 mW for 10 minutes. Then in order to form a repellent self organizing film on the entire surface of the glass substrate, the glass substrate and tridecafluoro-1,1,2,2 tetrahydrooctyltriethoxysilane 0.5 ml were contained in a same sealed container, and left for 48 hours at room temperature, so as to form a self organizing film which has a fluoroalkyl group on the surface of the glass substrate. The contact angle of the gold particle dispersed solution with respect to the substrate after treatment was about 60 deg.

The relation of the ejection voltage and the diameter of inkjet ejected liquid droplets of the gold particle dispersed solution on the glass substrate for which repellency treatment was performed by this method is shown in Table 1.

TABLE 1

| Ejection voltage (V) | 15 | 16 | 17 | 18 | 19 | 20 |
|---|---|---|---|---|---|---|
| Dot diameter ($\mu$m) | 58 | 64 | 66 | 67 | 70 | 72 |

With ejection at an ejection voltage of 20V, the diameter of a liquid droplet on the substrate was 72 $\mu$m. The volume of the inkjet liquid droplet at ejection voltage of 20V was about 25 pico-liters, and the diameter of the liquid droplet before attaching to the substrate was 36 $\mu$m.

At an ejection voltage of 20V, as a first reference example, lines were formed with a dot space of 35 $\mu$m, that is, a dot space where an inkjet liquid droplet directly contacts the previous liquid droplet already attached to the substrate, and it was found out that the line formed by this reference example had an extremely unstable shape, where many disconnected sections exist.

Figure 3:
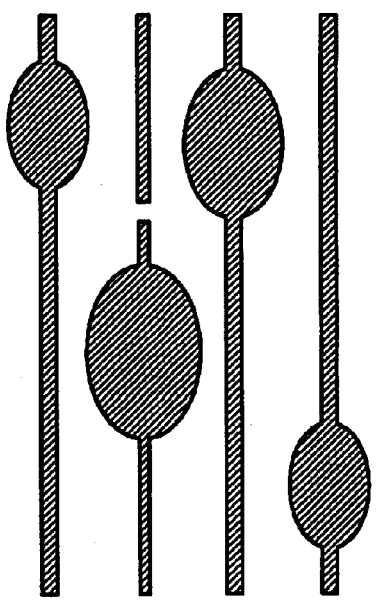
FIG. 3 is a plan view showing a conductive film wiring which is a film pattern formed in a reference example to be compared with the present invention.

As another reference example, lines were formed with a dot space of 60 $\mu$m, that is, a dot space where liquid droplets overlap for 12 $\mu$m on the substrate (about 17% of the dot diameter on the substrate), and it was found out that considerable bulging occurred due to the gathering of ink at irregular section, such as dust, on the substrate, as shown in FIG. 3. As time elapsed, more ink gathered on the bulges, and many disconnected sections were formed.

Figure 4:
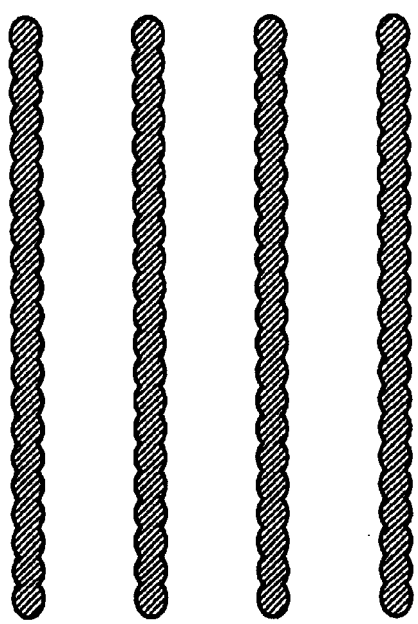
FIG. 4 is a plan view showing a conductive film wiring which is a film pattern formed in an example of the present invention.

Then lines were formed with a dot space of 70 $\mu$m, that is, a dot space where liquid droplets overlap 2 $\mu$m on the substrate (about 3% of a dot diameter on the substrate), and it was found out that stable lines without disturbance were formed, although a dot shape remained which made the edge line wavy, as shown in FIG. 4.

By performing heat treatment on this substrate using a hot plate at 300° C. for 30 minutes, gold lines with a film thickness of 0.5 $\mu$m was formed. The resistivity thereof was about 5 $\mu\Omega$cm.

3-2. EXAMPLE 2

Contact Angle of Substrate with Respect to Liquid

After the self organizing film was formed by the method of Example 1, the repellency of the substrate was dropped by irradiating ultraviolet onto the substrate, and conductive film lines were formed using the ink and the inkjet device used in Example 1.

As a reference example, the self organizing film was formed by the method of Example 1, then lines were formed on the substrate where ultraviolet was irradiated at 10 mW/cm$^2$ for 30 minutes. Since the self organizing film was completely removed, the substrate after ultraviolet irradiation was highly lyophilic, and the contact angle of the gold particle dispersed solution with respect to the substrate was about 10 deg. With ejection at ejection voltage 20V, the diameter of the liquid droplet on the substrate was 230 $\mu$m. When lines were formed with a dot space of 210 $\mu$m, that is, a dot space where liquid droplets overlap 20 $\mu$m on the substrate (about 9% of a dot diameter on the substrate), it was found out that lines with a very disturbed shape were formed since the liquid droplets spread too much on the substrate. Then lines were formed with a dot space of 100 $\mu$m, and it was found out that the disturbance of line shape was also outstanding.

So after forming the self organizing film by the method of Example 1, ultraviolet was irradiated onto the substrate at 10 mW/cm$^2$ for 5 minutes, and lines were formed on this substrate. Compared with the reference example, the removal amount of the self organizing film was small, so the substrate after ultraviolet irradiation had some degree of repellency, and the contact angle of the gold particle dispersed solution with respect to the substrate was about 30 deg. With ejection at ejection voltage 20v, the diameter of the liquid droplet on the substrate was 150 µm. When lines were formed with a dot space of 135 µm, that is, a dot space where liquid droplets overlap 15 µm on the substrate (10% of dot diameter on the substrate), it was found out that lines are not wavy, as shown in FIG. 4, although the line width was wider than the line formed in Example 1, and stable lines with a straight line shape were formed.

As another reference example, a silver particle dispersed solution was ejected onto the substrate by inkjet. The silver particle dispersed solution was prepared as follows. At first, 90 mg of silver nitrate was dissolved in 500 ml of water, heated to 100° C., then 10 ml of a 1% concentration of sodium citrate aqueous solution was added while stirring, and this solution was boiled for 80 minutes in this state. By this, a liquid, where silver colloid covered with citric acid to prevent coagulation was dispersed in an aqueous solution, was obtained. The average particle size of this silver colloid was 30 nm. After concentrating this liquid by centrifugation, water and a surface tension modifier were added to form ink, and the ink was adjusted so that the viscosity and surface tension thereof allow ejection by an inkjet head.

A silver particle dispersed solution adjusted in this way was ejected onto the substrate, where the self organizing film was formed by the method of Example 1, using the same inkjet device as Example 1, and conductive film lines were formed.

The contact angle of the silver particle dispersed solution with respect to the substrate was about 80 deg. with ejection at ejection voltage 20V, the diameter of the liquid droplet on the substrate was 48 µm. When lines were formed with a dot space of 45 µm, that is, a dot space where liquid droplets overlap 3 µm (about 6% of dot diameter on the substrate), it was found out that, when inkjet liquid droplets contacted the liquid already on the substrate, the droplets were taken into the liquid already on the substrate, and several inkjet liquid droplets gathered to form a large liquid drop, where lines are not formed at all.

3-3. EXAMPLE 3

Conductive film lines with thick film were formed by forming a line by the method of Example 1 repeatedly five times on the same line while executing the conductive film transformation step at 300° C. for 30 minutes each time a line is formed. The line width of the line after the first conductive film transformation step was 72 µm, and the line width of the line after the fifth conductive film transformation step was still 72 µm. The line shape was a relatively good straight line, unlike the wavy line shown in FIG. 4 of Example 1 The film thickness of the line after the fifth conductive film transformation step was 2.5 µm

3-4. EXAMPLE 4

Conductive film lines with large film thickness were formed by forming a line by the method of Example 1 repeatedly five times on top of the same line while executing the liquid drying step at 100° C. for 10 minutes each time a line was formed. The line width of the line after the first drying step was 72 µm, and the line width of the line after the conductive film transformation step at 300° C. for 30 minutes after the fifth ejection was 85 µm. The line shape was a relatively good straight line, unlike the wavy line shown in FIG. 4 of Example 1. The film thickness after the conductive film transformation step after the fifth ejection was 2.2 µm.

As a reference example, conductive film lines were formed by ejecting a line formed by the method of Example 1 repeatedly five times on top of the same line, without including heat treatment. The line width of the line after the first ejection was 72 µm, and the line width after the conductive film transformation step at 300° C. for 30 minutes after the fifth ejection was 150 µm. The line shape was a relatively good straight line, unlike the wavy line shown in FIG. 4 of Example 1, but some bulges were generated since the liquid amount was increased. The film thickness after the conductive film transformation step after the fifth ejection was 1.5 µm.

4-1. APPLICATION EXAMPLE 1

Liquid Crystal Device Using Conductive Film

Figure 5:
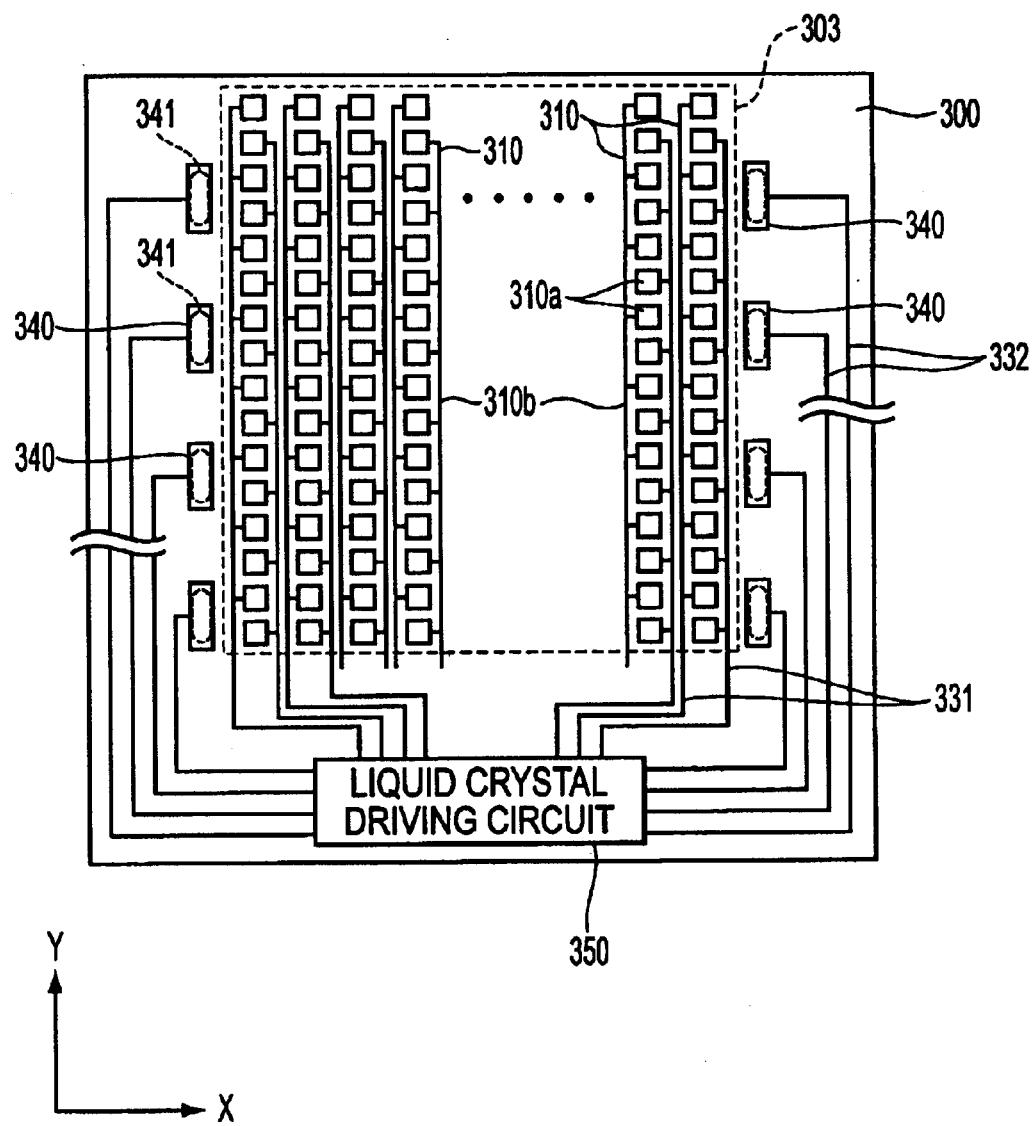
FIG. 5 is a diagram showing a-plane layout of a signal electrode and other elements on a substrate of a liquid crystal device according to the present invention.

As a first application example, a liquid crystal device, which is an example of the electro-optical device according to the present invention, will be described. FIG. 5 shows a plane layout of signal electrodes on the first substrate of the liquid crystal device according to this application example. The liquid crystal device according to the present application example is comprised of this first substrate, a second substrate where scanning electrodes are installed (not illustrated), and a liquid crystal filled between the first substrate and the second substrate (not illustrated).

As FIG. 5 shows, a plurality of signal electrodes 310 are installed in a multiple matrix on the pixel area 303 of the first substrate 300. Each signal electrode 310 in particular, which stretch in the Y direction, is further comprised of a plurality of pixel electrode section 310*a* which are installed corresponding to each pixel, and signal wiring section 310*b* which connect these pixel electrode sections in a multiple matrix shape.

The symbol 350 indicates a one-chip structure liquid crystal driving circuit, and this liquid crystal driving circuit 350 and one end of the signal wiring section 310*b* (bottom side in FIG. 5) are connected via the first lead-in wire 331.

The symbol 340 is a vertical conducting terminal, and this vertical conducting terminal 340 and a terminal installed on the second substrate, which is not illustrated, are connected with the vertical conducting material 341. The vertical conducting terminal 340 and the liquid crystal driving circuit 350 are connected by the second lead-in wire 332.

In the present application example, the signal wiring section 310*b*, first lead-in wire 331, and second lead-in wire 332 are formed by the conductive film pattern forming method according to the first embodiment respectively, using the above-mentioned film pattern forming device. According to this liquid crystal device, a liquid crystal device which rarely causes such defects as disconnection and short circuit of each wire, and can decrease size and thickness, can be provided.

4-2. APPLICATION EXAMPLE 2

Plasma Display Device Using Conductive Film

Figure 6:
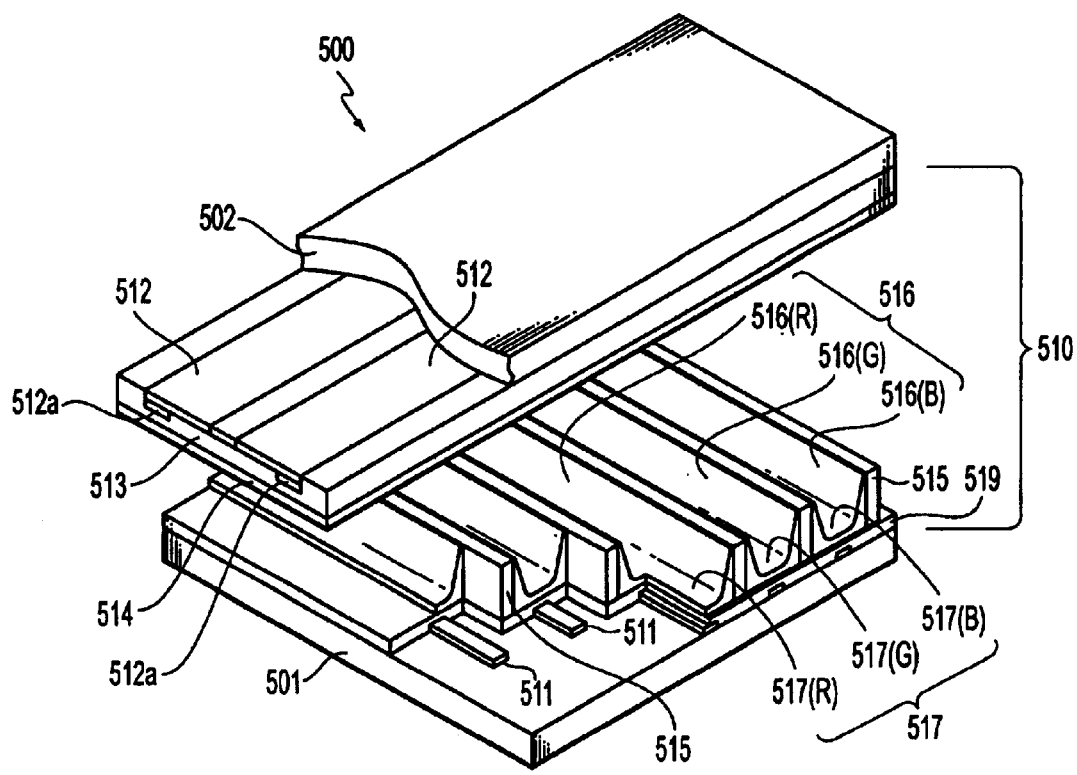
FIG. 6 is an exploded perspective view showing a plasma display device according to the present invention.

As a second application example, a plasma display device, which is another example of the electro-optical device of the present invention, will be described. FIG. 6 is an exploded perspective view showing the plasma display device 500 according to the present application example.

The plasma display device 500 of this application example is comprised of a glass substrate 501 and glass substrate 502 disposed facing each other, and discharge display section 510 formed between these glass substrates.

The discharge display section 510 is further comprised of a plurality of discharge chambers 516, and of the plurality of discharge chambers 516, three discharge chambers 516, that is, the red discharge chamber 516 (R), green discharge chamber 516 (G), and blue discharge chamber 516 (B) as a set constitutes one pixel.

On the top face of the above-mentioned (glass) substrate 501, address electrodes 511 are formed in stripes with a predetermined space, and the dielectric layer 519 is formed so as to cover the address electrodes 511 and the top face of the substrate 501, and on the dielectric layer 519, the barrier plates 515 are formed between the address electrodes 511 and 511 along each address electrode 511. The barrier plate 515 has partitions at predetermined positions (not illustrated) in a longitudinal direction, so that the address electrode 511 is separated with a predetermined space in a direction perpendicular to the address electrode 511, so basically rectangular areas are parted by the barrier plates stretching on both sides in the width direction of the address electrode 511 and barrier plates stretching in a direction perpendicular to the address electrode 511, discharge chambers 516 are formed corresponding to these rectangular areas, and three of these rectangular areas as a set constitute one pixel. Inside the rectangular area parted by the barrier plate 515, fluorescent substance 517 is disposed. The fluorescent substance 517 emits one of red, green and blue fluorescence, and the red fluorescent substance 517 (R) is disposed at the base of the red discharge chamber 516 (R), the green fluorescent substance 517 (G) is disposed at the base of the green discharge chamber 516 (G), and the blue fluorescent substance 517 (B) is disposed at the base of the blue discharge chamber 516 (B) respectively.

Adjacent to the glass substrate 502, transparent display electrodes 512, which are comprised of a plurality of ITOs, are formed in stripes with a predetermined space in a direction perpendicular to the address electrodes 511, and bus electrodes 512a, made of metal, are formed to compensate the high resistance ITOs. The dielectric layer 513 is formed to cover the display electrode 512 and the bus electrode 512a. Further, a protective film 514, made of MgO, is formed thereon.

Then the above-mentioned substrate 501 and substrate 2 of the glass substrate 502 are bonded such that the address electrodes 511 and the transparent display electrodes 512 are perpendicular to each other, and the space enclosed by the substrate 501, barrier plate 515, and protective film 514 formed at the glass substrate 502 side, is evacuated and rare gas is filled so as to form the discharge chamber 516. The display electrodes 512, formed adjacent to the glass substrate 502, are formed so that a set of two are arranged for each discharge chamber 516.

The address electrodes 511 and display electrodes 512 are connected to the AC power supply, not illustrated, and power is supplied to each electrode so that the fluorescent substances 517 are excited and emitted at the discharge display sections 510 at the required positions for color display.

In this application example, the address electrodes 511, display electrodes 512, and bus electrodes 512a are formed using the above-mentioned film pattern forming device respectively by the conductive film pattern forming method according to the first embodiment. According to the plasma display device of the present application example, a plasma display device which rarely causes such defects as disconnection and short-circuit of each electrode, and can decrease size and thickness, can be provided.

4-3. APPLICATION EXAMPLE 3

Electronic Device

Figure 7A:
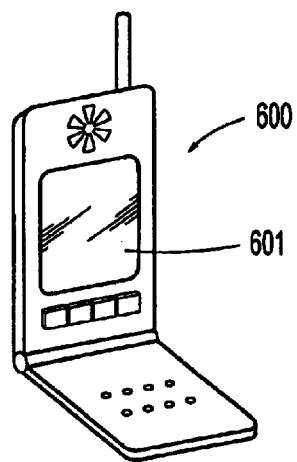
FIG. 7A–FIG. 7C are diagrams showing examples of an electronic device according to the present invention.

As the third application example, specific examples of the electronic device of the present invention comprised of the above-mentioned application examples will be described. FIG. 7A is a perspective view showing an example of a portable telephone. In FIG. 7A, 600 indicates the portable telephone main unit, and 601 indicates the liquid crystal display section comprised of the liquid crystal device of the <application example 1>.

Figure 7B:
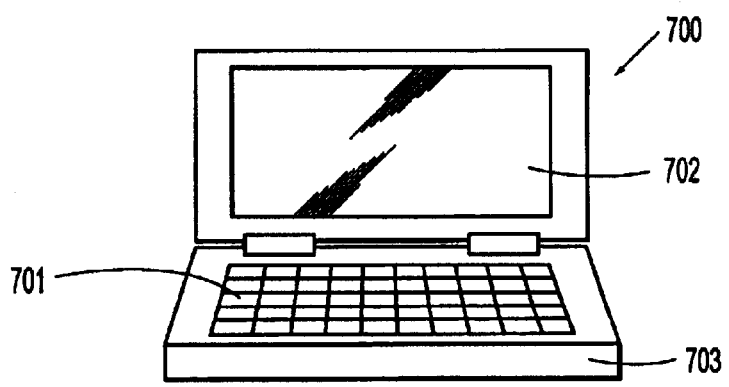

FIG. 7B shows a perspective view showing an example of a portable information processing devices, such as a word processor and personal computer. In FIG. 73, 700 indicates an information processing device, 701 indicates an input section such as a keyboard, 703 is an information processor main unit, and 702 is a liquid crystal displaying section comprised of the liquid crystal device of the <application example 1>.

Figure 7C:
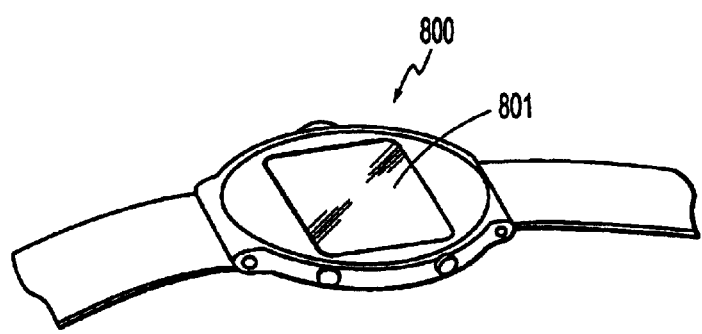
Figure 8:
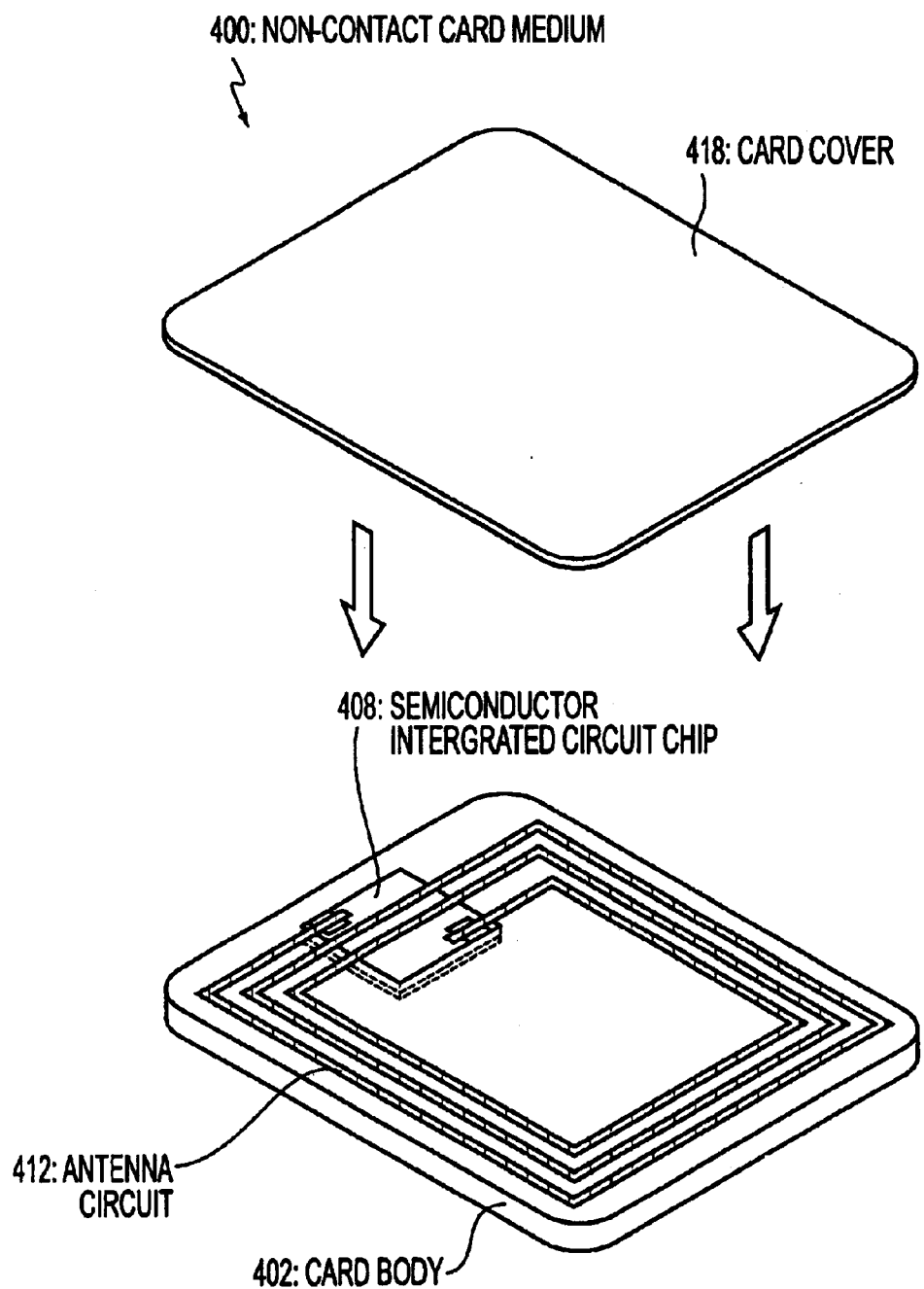
FIG. 8 is a diagram showing a structure of a non-contact card medium according to the present invention.

FIG. 7C is a perspective view showing an example or a watch type electronic device. In FIG. 7C, 800 indicates the watch main unit, and 801 is a liquid crystal display section comprised of the liquid crystal device of the <application example 1>.

The electronic device shown in FIG. 7A–FIG. 7C have the above-mentioned liquid crystal device of the <application example 1>, so such defects as disconnection and short circuit of wires rarely occur, and decreasing size and thickness is possible.

The electronic device of the present application example has the liquid crystal deice, but the electronic device may have another electro-optical device, such as the plasma display device in the <application example 2>and an organic electro-luminescence display device.

4-4. APPLICATION EXAMPLE 4

Non-Contact Card Medium Using Conductive Film

As the fourth application example, the non-contact card medium of the present invention will be described. The non-contact card medium 400 according to the present application example encloses the semiconductor integrated circuit chip 408 and an antenna circuit 412 in a body comprised of the card body 402 and card cover 418, and performs at least one of power supply and data transmission/reception with an external transmitter/receiver, not illustrated, by at least one of electromagnetic waves and electric capacitance coupling.

In the present application example, the above-mentioned antenna circuit 412 is formed by the conductive film pattern forming method according to the first embodiment using the above-mentioned film pattern forming device.

According to the non-contact card medium of the present application example, a non-contact card medium which rarely causes such defects as disconnection and short circuit of the antenna circuit 412, and can decrease size and thickness, can be provided.

4-5. APPLICATION EXAMPLE 5

Inkjet Type Recording Head Using Ferro-Electric Film

Figure 10:
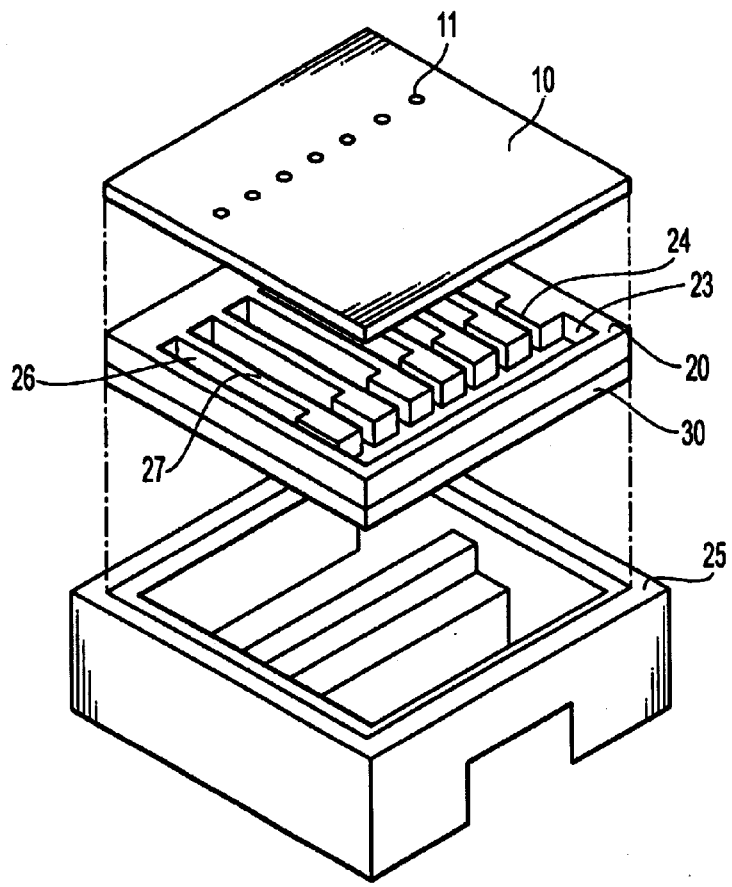
FIG. 10 is an exploded perspective view showing an inkjet recording head according to an application example of the present invention.
Figure 11:
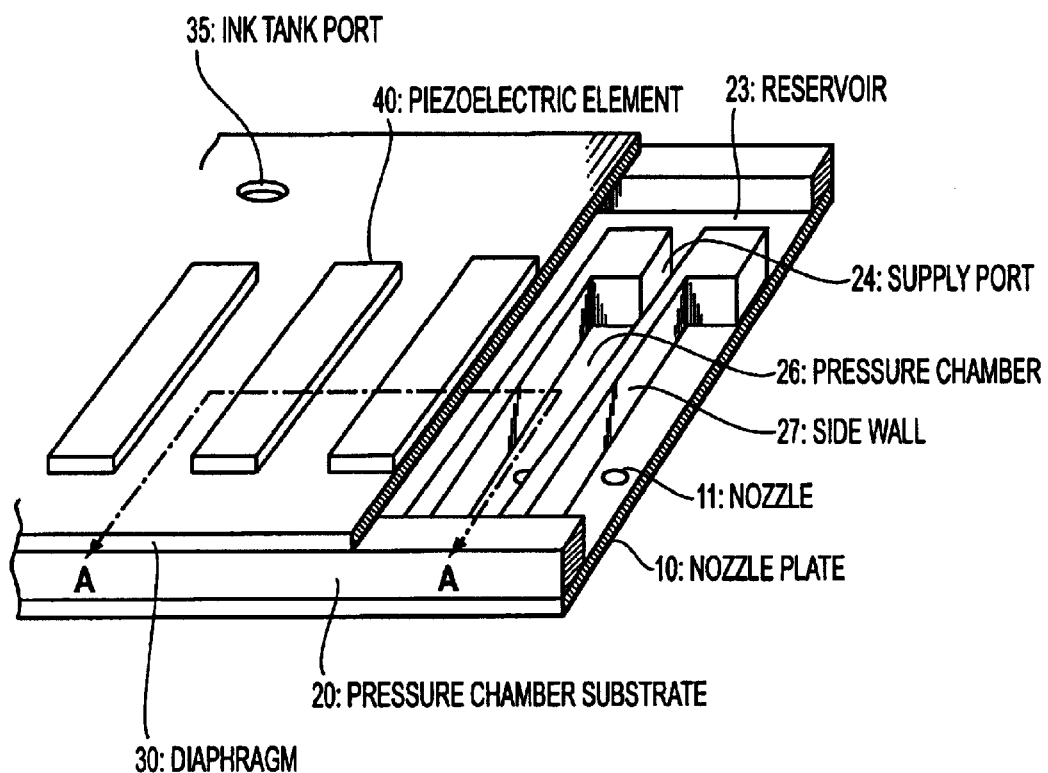
FIG. 11 is a cross-sectional view showing a part of the key section of the above-mentioned inkjet recording head.

As the fifth application example, an inkjet type recording head will be described. FIG. 10 is an exploded perspective view showing the inkjet type recording head according to the present application example. FIG. 11 is a cross-sectional view showing a part of a major section of the inkjet recording head; As FIG. 10 shows, this inkjet recording head is comprised of a nozzle plate 10, a pressure chamber substrate 20, a diaphragm 30, and a body 25.

As FIG. 11 shows, the pressure chamber substrate 20 further comprises a cavity 26, a side wall 27, a reservoir 23, and a supply port 24. The cavity 26 is a pressure chamber which is formed by etching with such a substrate as silicon. The side wall 27 partitions the cavity 26, and the reservoir 23 is connected to the ink tank port 35, and is structured to be a common channel that can supply ink to each cavity 26 when ink is filled. The supply port 24 is structured so as to supply ink to each cavity 26.

The diaphragm 30 is structured so as to bond to one surface of the pressure chamber substrate 20. On the diaphragm 30, piezoelectric element 40 is installed. The piezoelectric element 40 is formed to be a predetermined shape on the diaphragm 30.

The nozzle plate 10 is bonded to the pressure chamber substrate 20 so that the nozzles 11 thereof come to positions corresponding to each one of the plurality of cavities (pressure chambers) 26 formed on the pressure chamber substrate 20. The pressure chamber substrate 20 where the nozzle plate 10 is bonded is set inside the body 25, as shown in FIG. 10, to constitute the inkjet recording head 1.

Figure 9:
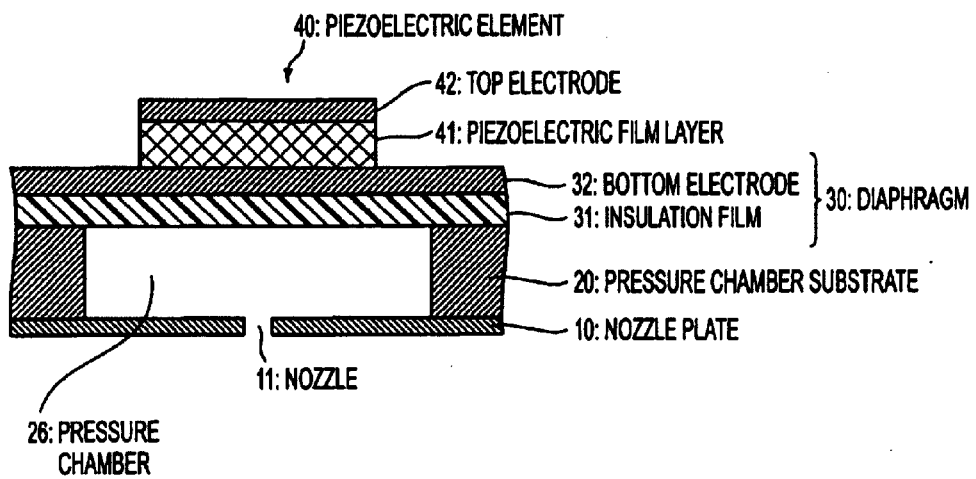
FIG. 9 is a cross-sectional view showing the layer structure of a piezoelectric element according to an application example of the present invention.

FIG. 9 is a cross-sectional view showing the layer structure of the piezoelectric element 40. As FIG. 9 shows, the diaphragm 30 is comprised of the insulation film 31 and bottom electrode 32, which are layered, and the piezoelectric element 40 is comprised of the piezoelectric layer 41 and top electrode 42, which are layered. The piezoelectric element functions by the bottom electrode 32, the piezoelectric layer 41, and the top electrode 42.

The insulation film 31 is made of a material without conductivity, such as silicon dioxide formed by performing thermal oxidation on the silicon substrate, and is structured so as to transform by the change of volume of the piezoelectric layer and to increase the internal pressure of the cavity 26 instantaneously.

The bottom electrode 32 forms a pair with the top electrode 42 for applying voltage to the piezoelectric layer, and is comprised of materials with conductivity, such as a titanium (Ti) layer, platinum (Pt) layer, and titanium (Ti) layer, which are layered. The reason why the bottom electrode is structured by stacking a plurality of layers in this way is to improve the adhesion between the platinum layer and piezoelectric layer, and between the platinum layer and insulation film.

The piezoelectric layer 41 is comprised of a ferro-electric substance, and PZT is used for this application example. A preferable ferro-electric substance, other than PZT, is, for example, magnesium niobate lead zirconate titanate (Pb (Mg, Nb) (Zr, Ti) O$_3$: PMN-PZT).

The top electrode film 42 becomes an electrode at one side for applying voltage to the piezoelectric layer, and is comprised of a conductive material, such as platinum (Pt).

In this application example, the piezoelectric layer 41 is formed by the ferro-electric film pattern forming method according to the third embodiment using the above-mentioned film pattern forming device respectively. According to the inkjet recording head of the present application example, an inkjet recording head which rarely causes such defects as disconnection and short circuit of ferro-electric film patterns, and can decrease size and thickness, can be provided.

4-6. APPLICATION EXAMPLE 6

TFT Substrate Using Silicon Film

Figure 12A:
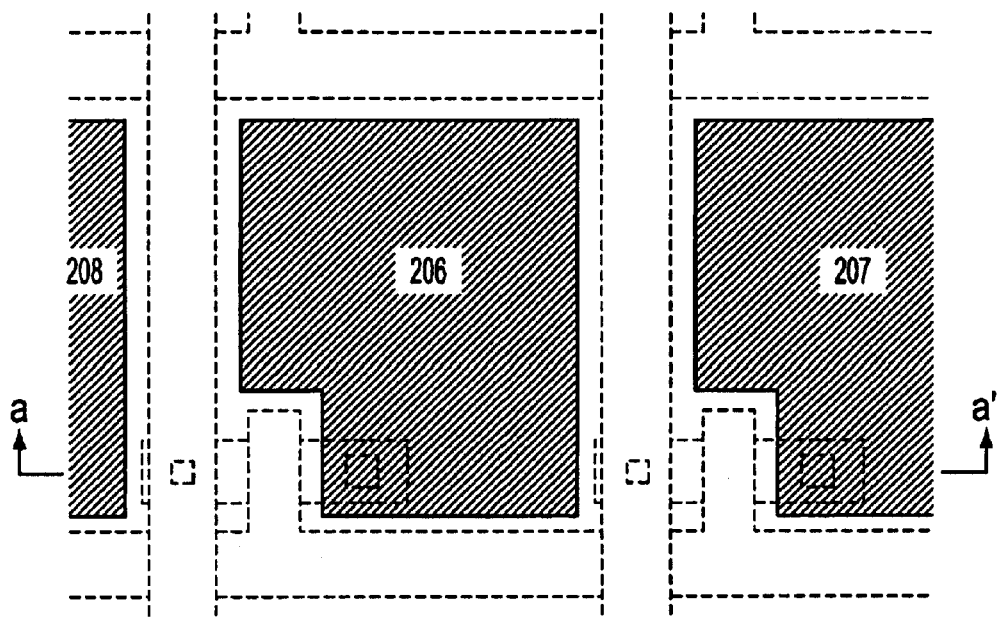
FIG. 12A is a plan view showing a TFT substrate according to an application example of the present inventions and FIG. 12B is a cross-sectional view thereof sectioned at a–a' in FIG. 12A.
Figure 12B:
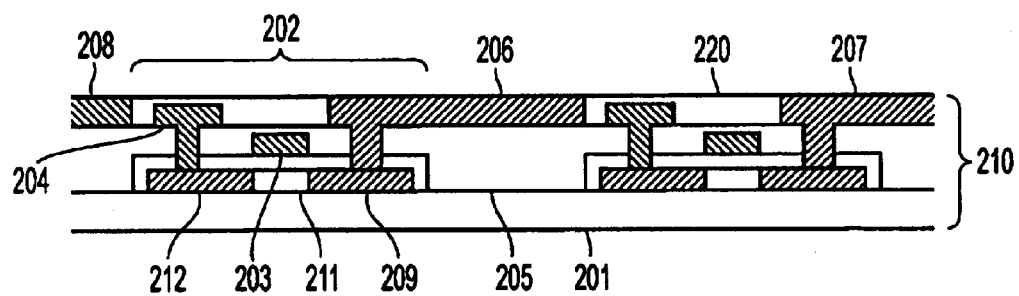

As the sixth application example, a TFT substrate will be described. FIG. 12A is a plan view showing the TFT substrate according to the present application example, and FIG. 12B is a cross-sectional view thereof sectioned at the a–a' line. As FIG. 12 shows, this TFT substrate 210 is comprised of a plurality of thin film transistors 202 on the substrate 201. The source electrode 212 of the thin film transistor is connected to the source line 204, the gate electrode 203 is connected to the signal line, and the drain electrodes 209 are connected to the pixel electrodes 206, 207 and 208 respectively.

The silicon thin film 211 is formed between the source electrode 212 and drain electrode 209, and a channel area is formed here. The silicon thin film 211 is formed by the silicon film pattern forming method according to the second embodiment.

Insulation films 205 and 220, for example, are formed between the signal line and the electrodes to insulate them from each other.

The TFT substrate 210 configured in this way is connected to the driving circuit, not illustrated, is bonded with the liquid crystal panel, not illustrated, and is used as the liquid crystal display, for example. According to this TFT substrate, the above-mentioned silicon film pattern can be formed to be fine and accurate. Also a decrease in size and thickness is possible. For the following inventions 1 to 10, the above-mentioned preferred embodiments can be provided. The present invention, however, shall not be limited to these embodiments.

What is claimed is:

1. A method of forming a functional film pattern by ejecting liquid containing functional components onto a substrate by inkjet comprising:

ejecting the liquid by inkjet onto the substrate having a face where the contact angle with respect to the liquid is 30 deg. or more and 60 deg. or less; and transforming said ejected liquid into a functional film by a heat treatment;

wherein, in said step of ejecting by inkjet, the liquid is ejected such that the distance between the centers of the inkjet liquid droplets adjacent to each other on said substrate is greater than the sum of the radius of said inkjet liquid droplets attached to said substrate and the radius of said inkjet liquid droplets before attaching to said substrate, and is smaller than double the radius of said inkjet liquid droplets attached to said substrate.

2. A method of forming a functional film pattern by ejecting liquid containing functional components onto a substrate by inkjet comprising:

ejecting the liquid by inkjet onto the substrate having a face where the contact angle with respect to the liquid is 30 deg. or more and 60 deg. or less;

transforming said ejected liquid into a functional film by a heat treatment;

wherein said liquid droplets contain conductive particles, and wherein, in said step of ejection by inkjet, the liquid is ejected such that 1% or more and 10% or less of the diameter of the liquid overlap when the liquid is attached to said substrate.

3. A method of forming a functional film pattern by ejecting liquid containing functional components onto a substrate by inkjet comprising:

ejecting the liquid by inkjet onto the substrate having a face where the contact angle with respect to the liquid is 30 deg. or more and 60 deg. or less;

transforming said ejected liquid into a functional film by a heat treatment;

ejecting the liquid again onto said functional film by inkjet after executing said ejecting step and said transforming step; and transforming the lately ejected liquid into a functional film by a heat treatment.

4. A method of forming a functional film pattern by ejecting liquid containing functional components onto a substrate by inkjet comprising:

ejecting the liquid by inkjet onto the substrate having a face where the contact angle with respect to the liquid is 30 deg. or more and 60 deg. or less;

transforming said ejected liquid into a functional film by a heat treatment;

drying said ejected liquid after said ejecting step and before the step of transforming said ejected liquid into a functional film; and ejecting the liquid again by inkjet on said dried liquid.

5. A conductive film wiring formed by the method of forming a functional film pattern according to any one of claims 1–4, wherein a conductive film is formed as said functional film using conductive particles as said functional components.

6. An electro-optical device comprising the conductive film wiring according to claim 5.

7. An electronic device comprising the electro-optical device according to claim 6.

8. A non-contact card medium comprising the conductive film wiring according to claim 5 as an antenna circuit.

* * * * *